United States Patent
Maloney et al.

(10) Patent No.: US 6,545,520 B2
(45) Date of Patent: Apr. 8, 2003

(54) METHOD AND APPARATUS FOR ELECTRO-STATIC DISCHARGE PROTECTION

(75) Inventors: Timothy J. Maloney, Palo Alto, CA (US); Alper Ilkbahar, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/820,111

(22) Filed: Mar. 28, 2001

(65) Prior Publication Data

US 2002/0140489 A1 Oct. 3, 2002

(51) Int. Cl.[7] .......................... H02H 9/04; H03K 19/094
(52) U.S. Cl. ..................... 327/313; 327/112; 327/318; 361/56
(58) Field of Search ................................ 327/112, 310, 327/313, 318; 361/56, 111

(56) References Cited

U.S. PATENT DOCUMENTS

| | | | |
|---|---|---|---|
| 5,345,357 A | * 9/1994 | Pianka | 361/56 |
| 5,745,323 A | * 4/1998 | English et al. | 361/111 |
| 5,783,851 A | * 7/1998 | Kinoshita et al. | 361/56 |
| 5,825,603 A | 10/1998 | Parat et al. | |
| 5,877,927 A | 3/1999 | Parat et al. | |
| 5,907,464 A | * 5/1999 | Maloney et al. | 361/111 |
| 6,034,552 A | * 3/2000 | Chang et al. | 361/56 |
| 6,118,323 A | * 9/2000 | Chaine et al. | 327/333 |
| 6,249,410 B1 | * 6/2001 | Ker et al. | 361/56 |
| 6,369,994 B1 | * 4/2002 | Voldman | 361/56 |

OTHER PUBLICATIONS

S. Dabral, R. Aslett, T. Maloney, "Core Clamps for Low Voltage Technologies," 1994 EOS/ESD Symposium Proceedings, pp. 141–149.

S. Dabral and T.J. Maloney, "Basic ESD and I/O Design," Published by Wiley Intescience, Nov. 1998, pp. 61–63.

T.J. Maloney, "Designing Power Supply Clamps for Electrostatic Discharge Protection of Integrated Circuits," Microelectronics Reliability, vol. 38, Issue 11, pp. 1691–1703 (Nov., 1998).

J.Smith, "An Anti–Snapback Circuit Technique for Inhibiting Parasitic Bipolar Conduction During EOS/ESD Events, " 1999 EOS/ESD Symposium Proceedings, pp. 62–69.

T.J. Maloney, "Novel Clamp Circuits for IC Power Supply Protection," IEEE Transactions on Components, Packaging, and Manufacturing Technology —Part C, vol. 19, No. 3 Jul. 1996, pp. 150–161.

Timothy J. Maloney and Wilson Kan, "Stacked PMOS Clamps for High Voltage Power Supply Protection," EOS/ESD Symposium Proceeding, 1999, pp. 70–77.

* cited by examiner

Primary Examiner—Timothy P. Callahan
Assistant Examiner—Terry L. Englund
(74) Attorney, Agent, or Firm—Cynthia T. Faatz

(57) ABSTRACT

A circuit includes an output driver, where the output driver includes a pull-up device and a pull-down device. The pull-up device has a first control terminal that is responsive to an RC-timer so as to bias the pull-up device on in response to an electrostatic discharge (ESD) event that activates a device coupled to an output of the RC-timer. The pull-down device has a second control terminal that, for one aspect, is in a substantially indeterminate state (i.e. the second control terminal may be a "1", "0" or some other voltage, which may or may not be within the voltage range between "1" and "0") during the ESD event.

17 Claims, 4 Drawing Sheets

METHOD AND APPARATUS FOR ELECTRO-STATIC DISCHARGE PROTECTION

BACKGROUND

1. Field

The present invention relates to electrostatic discharge (ESD) protection schemes for microelectronics and, more specifically, to biased ESD protection schemes for microelectronics.

2. Background Information

Advancements in silicon processing technologies employed to manufacture microelectronics, such as integrated circuits (ICs), may include reduction in circuit element sizes. Such reduction in circuit element sizes, which may be referred to as "scaling", is one way the performance of microelectronic devices manufactured employing such processes may be improved. Current processing technologies have circuit element dimensions, such as transistor sizes, which are smaller than 200 nanometers (nm). Such processes are typically referred to as "deep sub-micron" processes.

However, such scaling may also result in undesired effects. For example, as circuit element sizes are reduced, or "scaled", such circuit elements may become more susceptible to damage from electrostatic discharge (ESD) events due, at least in part, to thinner oxides and/or shallower junctions typically associated with such scaled circuit elements. An ESD event may occur, for example, when an electrically charged body comes in contact with, or in close proximity to a microelectronic device. Alternatively, an ESD event may occur when an electric charge accumulates on a microelectronic device and that microelectronic device then comes in contact with, or in close proximity to a grounded body. Of course, other situations also exist that may result in an ESD event.

Experimentation has shown that p-channel devices embodied on microelectronic components manufactured using advanced microelectronic manufacturing processes may be particularly susceptible to damage from certain types of ESD events, as compared with prior manufacturing processes. This susceptibility may be due, at least in part, to scaling in such processes and, therefore, may be exacerbated by further scaling on future manufacturing processes. Additionally, scaling may result in n-channel devices becoming more susceptible to ESD damage from snap-back events, such as those leading to secondary breakdown. Therefore, based on the foregoing, alternative schemes for ESD protection are desirable.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood that the present invention may be practiced without these specific details. In other instances, well-known methods, procedures, components and circuits have not been described in detail, so as not to obscure the present invention.

As was indicated above, transistors, such as n-channel and p-channel transistors, employed on advanced microelectronic components may become more susceptible to electrostatic discharge (ESD) events due, at least in part, to scaling of the dimensions of such transistors. Such dimensions include, but are not limited to, gate length, junction depth, and oxide thickness.

As was also indicated above, experimentation has shown that p-channel devices on current and future microelectronic manufacturing processes may be particularly susceptible to certain ESD events, as compared with earlier manufacturing processes. This experimentation has also shown that such susceptibility may be more pronounced when a p-channel device is biased "off", or in a non-conducting state. Conversely, experimentation has shown that biasing a p-channel device "on", or in a conducting state during such an event may reduce the likelihood of damage from such an event. Additionally, biasing an n-channel device "on" during an ESD event may result in damage to such a device, depending on the particular embodiment. Such damage may result from a well-known phenomenon typically referred to as secondary breakdown. However, in other embodiments, n-channel devices in the "off" state may be susceptible to damage from another well-known phenomenon typically referred to as punch through.

Figure 1:
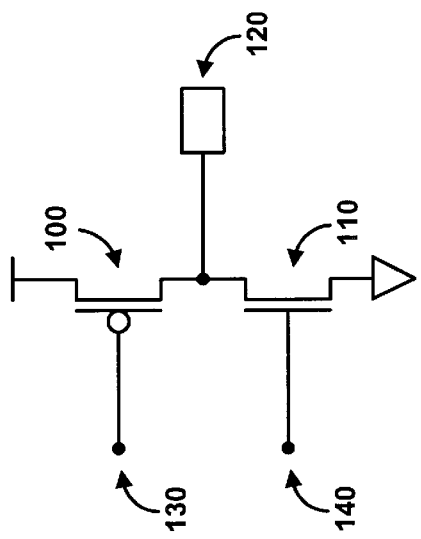
FIG. 1 is a schematic drawing illustrating a prior art output buffer circuit.

Such susceptibilities have been observed on traditional output drivers, such as the embodiment illustrated in prior art FIG. 1. Such an output driver may also be termed an inverter, and may, for example, be employed in digital logic circuits manufactured using complementary metal-oxide semiconductor (CMOS) processes. In such digital logic circuits, voltage signals may be expressed in terms of "1" and "0". Typically "1" corresponds to a voltage that is substantially equivalent to a power supply voltage for such a circuit and "0" corresponds to a voltage which is substantially equivalent to electrical ground, or ground. For the sake of simplicity, and for purposes of this disclosure, such voltage signals will hereafter be referred to as "1" and "0", consistent with the foregoing.

During the operation of a circuit component employing such an output driver, such as the one illustrated in FIG. 1, the output voltage signal present on output terminal 120 depends, at least in part, on the voltage signals applied to the gate terminals, 130 and 140, of p-channel transistor 100 and n-channel transistor 110, respectively. Typically, during operation, a voltage signal of substantially the same value would be applied to gate terminals 130 and 140. For example, were "1" to be applied to gate terminals 130 and 140, this would typically result in "0" being applied to output terminal 120 via n-channel transistor 110, which would be "on" while p-channel transistor 100 was "off." Thus the signal is "inverted" from "1" to "0." Conversely, were "0" applied to gate terminals 130 and 140, this would typically result in "1" being applied to output terminal 120 via p-channel transistor 100, which would be on while n-channel transistor 110 was "off."

However, during an ESD event, which is typically transient in nature, gate terminals 130 and 140 may be indeterminate. In this regard, gate terminals 130 and 140 may be "1", "0" or some other voltage, which may or may not be within the voltage range between "1" and "0." One situation that may be undesirable is when the gate terminal 130 of p-channel transistor 100 has a voltage of substantially "1" or higher applied thereto while a power supply terminal for p-channel transistor 100 also ramps to "1" or higher. In this situation, p-channel transistor 100 would typically be "off." As was indicated above, experimentation has shown that a p-channel device may be particularly susceptible to damage when biased "off" during such an ESD event. Such an event may result in physical damage to the p-channel device, impairing or destroying its ability to operate as desired.

Another situation that may be undesirable is when "0" is applied to gate terminal 130 and "1" is applied to gate terminal 140 while a power supply voltage for the circuit illustrated in FIG. 1 ramps to "1" or higher, as may occur during an ESD event. This would result in both n-channel transistor 110 and p-channel transistor 100 being biased "on" during the ESD event, effectively shunting a power supply terminal for the output driver to the ground terminal. As was indicated above, for certain embodiments, this may result in damage to n-channel transistor 110 due, at least in part, to secondary breakdown effects.

Figure 2:
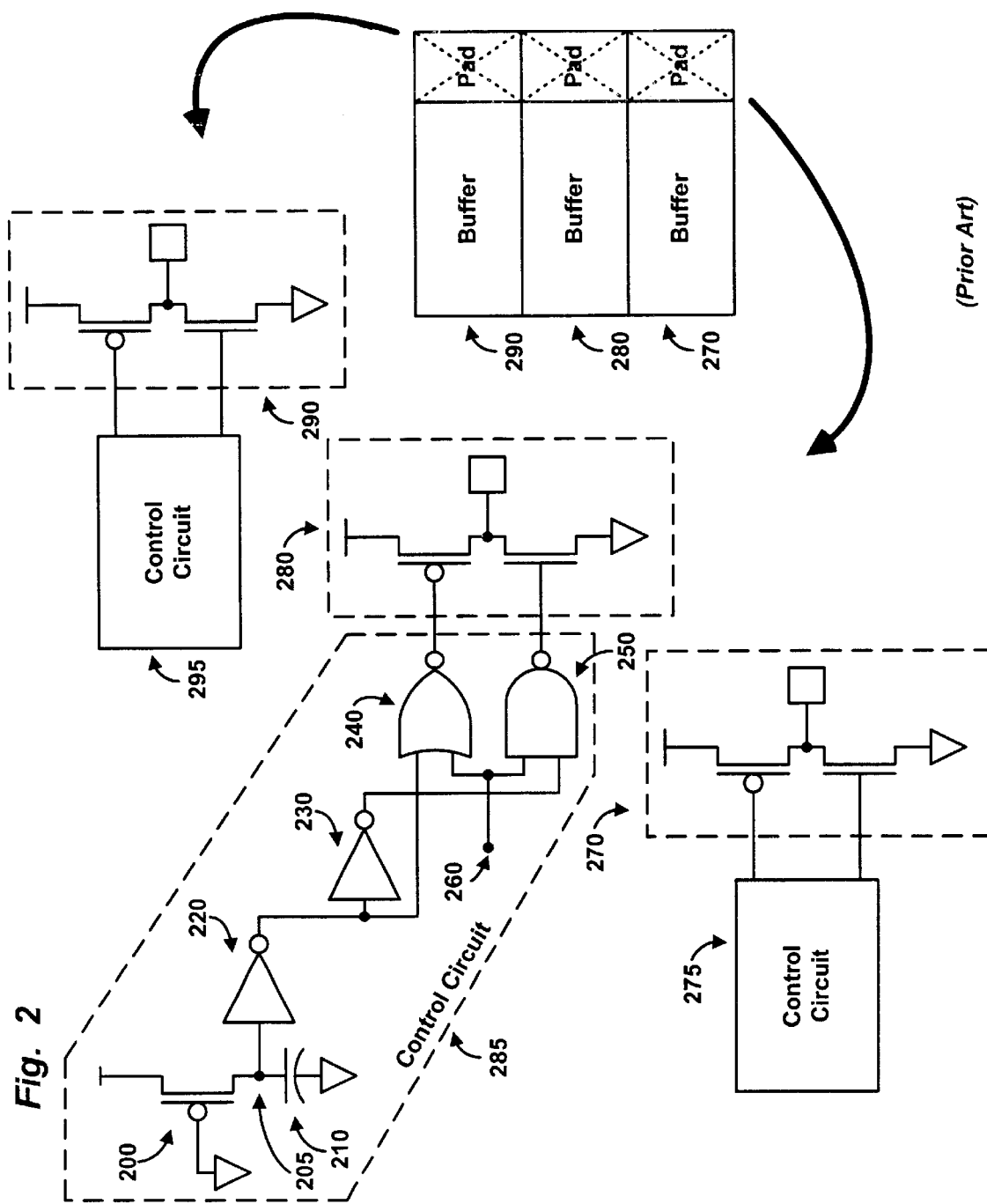
FIG. 2 is a schematic drawing illustrating a prior art circuit that may be employed for power supply clamping during an electrostatic discharge (ESD) event.

FIG. 2 is a schematic diagram illustrating a prior embodiment of a power supply clamp that may be employed on a microelectronic component for ESD protection. The use of power supply clamps in ESD protection schemes is well-known. In this particular embodiment of a power supply clamp, employing the output drivers of a microelectronic component on which such a circuit may be implemented may form the clamp. In this regard, output buffers 270, 280 and 290 are employed in such a fashion. The number of buffers employed in this manner may depend on the specific embodiment in which such a power supply clamp is being implemented. For this particular embodiment, output buffers 270, 280 and 290 comprise output drivers and pads. While alternatives exist, such pads may comprise flip-chip connection bumps or, as one alternative, bond pads. The output drivers may comprise drivers that are substantially similar to the driver illustrated in FIG. 1, and as was previously described.

The embodiment illustrated in FIG. 2 further comprises control circuitry that may be employed to bias the transistors included in output buffers 270, 280 and 290 to known conditions during an ESD event. For this particular embodiment, both the nchannel and p-channel transistors would typically be biased "on" during such an event. In this respect, biasing both transistors in output buffers 270, 280 and 290 "on" would, therefore, shunt or clamp the power supply terminal included in such a circuit to the ground terminal included in that circuit. In this regard, though alternatives exist, control circuits 275, 285 and 295 may be implemented and operate in substantially the same fashion. Therefore, for simplicity, only the operation of the detailed schematic drawing of control circuit 285 will be described herein.

Control circuit 285 comprises a resistive capacitive timer (RC-timer), which includes a p-channel transistor 200 with its gate terminal connected to ground and capacitor 210. It is well-known that a p-channel transistor connected in this fashion will typically operate as a resistor, therefore, p-channel 200 would function, at least in part, as the resistance in the RC-timer for control circuit 285. The output terminal 205 of the RC-timer is coupled with the input terminal of the first inverting stage 220 of two inverting stages, 220 and 230. These inverting stages may be used to buffer an output signal of the RC-timer. During normal operation of such a circuit, the output terminal 205 of the RC-timer would typically be at a voltage substantially equivalent to "1." During an ESD event, such an RC-timer would typically be designed to apply a voltage to its output terminal 205 that would be below the trip threshold of first inverting stage 220, or approaching "0."

In this respect, when the voltage applied to output terminal 205 transitions from "1" to below the trip threshold of inverting stage 220, this may indicate the occurrence of an ESD or over-voltage event. As a result, the output terminal of first inverting stage 220 would then typically transition from "0" to "1." In turn, the output terminal of second inverting stage 230 would then typically transition from "1" to "0." This sequence of events may then further result in "0" being applied to the output terminal of NOR gate 240 and "1" being applied to the output terminal of NAND gate 250, which would in turn bias both the p-channel and n-channel transistors of output buffer 280 "on." In this situation, the result would be clamping the power supply terminal to the ground terminal for this circuit via output buffer 280. In comparison, during normal operation the output terminal 205 of the RC-timer would typically be at "1", therefore "0" would be present on the output terminal of inverting stage 220 and "1" would be present on the output terminal of inverting stage 230. In this situation, NOR gate 240 and NAND gate 250 would operate substantially as inverters and, therefore, the state of output buffer 280 could be controlled via an electrical signal applied to data terminal 260.

While the embodiment illustrated in FIG. 2 may result in the gate terminals of an output driver being in a substantially known state during an ESD event, such embodiments still have certain disadvantages. For example, because both transistors in output buffers 270, 280 and 290 may be biased "on" during an ESD event, such a circuit may be susceptible to damage to the n-channel transistor, as was previously described with respect to FIG. 1. Additionally, each output buffer in such embodiments would typically require, at least, a dedicated NAND gate and a dedicated NOR gate, such as 250 and 240, for control circuitry. Were such circuitry not employed or reduced, this may result in the total amount of circuitry and the corresponding circuit area of such embodiments being reduced. Such a reduction is desirable for a number of reasons such as cost, power consumption and performance.

Figure 3:
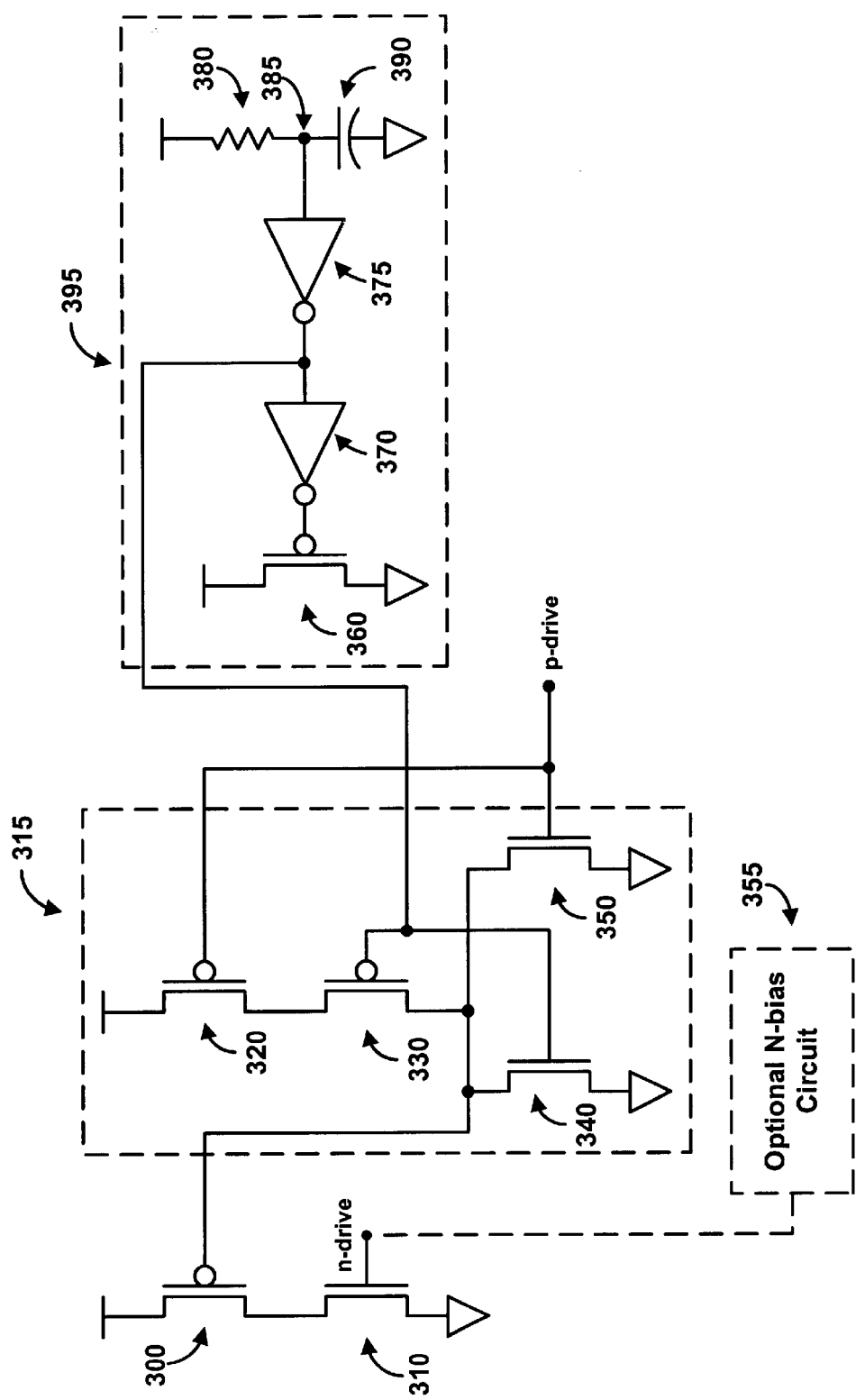
FIG. 3 is a schematic drawing illustrating an embodiment of an ESD protection scheme in accordance with the invention.

FIG. 3 is a schematic diagram illustrating an embodiment of a circuit in accordance with the invention that addresses at least some of the foregoing concerns. While the invention is not limited in scope to any particular embodiment, the embodiment in FIG. 3 comprises power supply clamp 395; NOR gate 315, which includes transistors 320, 330, 340 and 350; and an output driver that includes transistors 300 and 310. Additionally, this embodiment may employ an optional N-bias circuit 355, which will be discussed in more detail hereinafter with respect to FIG. 4.

In this particular embodiment, power supply clamp 395 includes an RC-timer, comprising resistor 380 and capacitor 390; a first inverting stage 375, a second inverting stage 370; and an ESD clamping device 360. Alternatively, without limitation, resistor 380 may comprise a p-channel transistor employed as was previously described with respect to the RC-timer illustrated in FIG. 2. For this embodiment, ESD clamping device 360 comprises a p-channel transistor 360 with its gate terminal coupled with the output terminal of second inverting stage 370. Typically, for such embodiments, p-channel transistor 360 would be a relatively wide transistor, for example, on the order of thousands of microns of gate width. As is well-known, a micron is one millionth of a meter. This technique from power supply clamping allows ESD current distribution in p-channel transistor 360, which, as a result, may protect other circuit elements from the current typically associated with an ESD event. Because power-supply clamping during an ESD event, for this embodiment, is accomplished via p-channel transistor 360 at least a portion of the dedicated control circuitry associated with the embodiment illustrated in FIG. 2 may be eliminated, thus potentially reducing circuitry and circuit area, which is desirable. The invention is, of course, not limited to this specific implementation and alternatives, such as those discussed in more detail hereinafter, may exist.

For this embodiment, the output terminal of the first inverting stage 375 of power supply clamp 395 may be coupled with one input of NOR gate 315. In this regard, if an ESD event is detected by the RC-timer, that is, the voltage signal applied to output terminal 385 of the RC-timer falls below the trip threshold of first inverting stage 375, this would typically result in "1" being applied to the gate terminals of transistors 330 and 340. In turn, this would typically result in "0" being applied to the gate terminal of transistor 300, turning that transistor "on", which, as was previously discussed, would be a desired result in such a scenario.

The invention is, of course not limited in scope to this particular embodiment and many alternatives exist. For example, in one alternative embodiment the output terminal of first inverting stage 375 may be coupled with two or more output drivers in a substantially similar fashion as described by the foregoing. Another example of an alternative embodiment may comprise a dedicated RC-timer and a single inverting stage. Such a circuit may be employed to bias one or more output drivers in a substantially similar manner has been described above. These alternatives are, of course, merely example alternative embodiments in accordance with the invention, and in no way limit the scope of the invention.

In embodiments in accordance with the invention, such as illustrated in FIG. 3, an optional N-bias circuit 355 may or may not be employed, depending on the particular embodiment. In embodiments that employ n-channel transistors in their output buffers that are more resistant to ESD events, it may be advantageous not to employ such a bias circuit, as circuitry and circuit area may be reduced or conserved. However, for embodiments that employ n-channel transistors that are relatively less resistant to damage from an ESD event, it may be advantageous to employ such a circuit, as the likelihood of damage to such n-channel transistors from an ESD event may be reduced.

Figure 4:
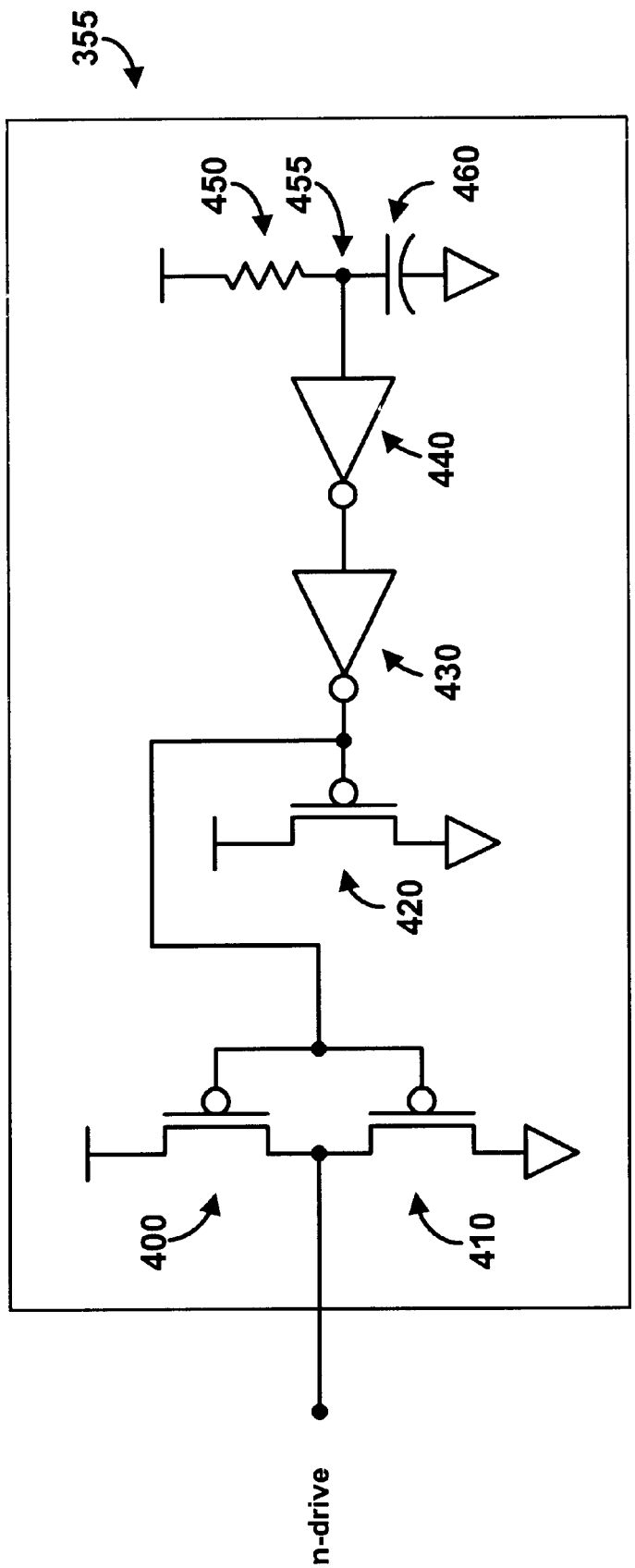
FIG. 4 is a schematic drawing illustrating an embodiment of an N-bias circuit in accordance with the invention that may be employed with the embodiment illustrated in FIG. 3.

An embodiment of an N-bias circuit 355 in accordance with the invention that may be employed by the embodiment of FIG. 3 is illustrated by the schematic drawing in FIG. 4. While the invention is, of course, not limited in scope to any particular embodiment, this embodiment comprises two p-channel transistors 400 and 410, which are typically of substantially similar physical dimensions and electrical characteristics. The gate terminals of these transistors are coupled with the output terminal of a second inverting stage of a power supply clamp, such as the one previously described, though the invention is not so limited.

While the invention is not so limited, embodiments of the invention, such as illustrated in FIG. 4, may employ a power supply clamp such as 395, as opposed to employing a dedicated power supply clamp. For this embodiment, when the RC-timer detects an ESD event and its output voltage falls below the trip threshold of first inverting stage 440, "1" will be applied to the output terminal of first inverting stage 440 as a result. Likewise, "0" would then be applied to the output terminal of second inverting stage 430 resulting in "0" being applied to the gate terminals of p-channel transistors 400 and 410, turning these transistors "on." In the "on" state, p-channel transistors 400 and 410 would substantially function as a resistor-divider, applying a voltage that is substantially fixed in ratio to the voltage differential between a power supply voltage and a ground voltage for such a circuit to the gate terminal of an n-channel transistor included in an output driver, such as illustrated in FIG. 3. In embodiments where p-channel transistors 400 and 410 have substantially similar electrical characteristics, as was previously described, this ratio would be approximately 1:2. That is, the voltage applied to the control terminal of the n-channel device of the output driver would be approximately one-half of the voltage differential between the power supply voltage and ground. In this situation, the n-channel may be termed to be "half-biased." This "half-bias" may be advantageous as it would result in balancing both conduction in the transistor channel and any electric fields applied at the terminals of the n-channel transistor during an ESD event. This balancing of conduction and electric fields may, in turn, reduce the risk of damage to such a transistor during such an event. Of course, depending on the embodiment, other ratios may be more effective, or other methods of "half-biasing" such an n-channel transistor may be employed.

Alternatively, certain embodiments may exist where it is desirable to have snapback occur at the highest possible voltage. In this situation, it may be preferable to apply "0" to the gate terminal of an n-channel pull-down device, such as n-channel transistor 310. In such an embodiment, the voltage applied to the gate terminal would be 0 (zero). The invention is, of course, not limited in scope in this respect, and alternative methods of biasing a pull-down device exist.

A method in accordance with the invention may comprise detecting an ESD event, generating an electronic signal in response to the ESD event and then biasing a pull-up device of an output driver to the "on" or conducting state while applying a substantially indeterminate voltage to a control terminal of a pull-down device of the output driver. Such a method may further comprise generating an electronic signal in response to the detected ESD event by employing an RC-timer and further, turning on an ESD clamping device in response to the detected ESD event.

Alternatively, such a method may comprise applying a voltage to the control terminal of the output-driver's pull-down device, where the voltage has a substantially constant ratio to a voltage differential between a power supply voltage and a ground supply voltage. Such a voltage may be generated, for example, by employing a switched resistor divider, though the invention is not limited in this respect.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A circuit comprising:
   an output driver including a pull-up device and a pull-down device;
   said pull-up device comprising a first control terminal responsive to an RC-timer to bias said pull-up device on in response to an electrostatic discharge (ESD) event that causes a device coupled to an output of said RC-timer to be activated; and
   said pull-down device comprising a second control terminal, said second control terminal being coupled in said circuit so as to be in a substantially indeterminate state in response to said ESD event,
   wherein said RC-timer comprises a resistor-capacitor (RC) network, a first inverting stage and a second inverting stage; wherein said RC network is coupled with an input terminal of said first inverting stage; and an output terminal of said first inverting stage is coupled with an input terminal of said second inverting stage.

2. The circuit of claim 1, wherein an output terminal of said second inverting stage is coupled with a control terminal of said device that is an ESD clamping device.

3. The circuit of claim 2 wherein said ESD clamping device comprises a p-channel transistor and said control terminal of said ESD clamping device comprises a gate terminal of said p-channel transistor.

4. The circuit of claim 1, wherein said first control terminal is coupled with said output terminal of said first inverting stage via a NOR gate, wherein said output terminal of said first inverting stage is coupled with a first input terminal of said NOR gate, logic circuitry for controlling said pull-up device during normal operation of the output driver is coupled with a second input terminal of said NOR gate, and an output terminal of said NOR gate is coupled with said first control terminal.

5. The circuit of claim 4, wherein said NOR gate comprises a two-input NOR gate.

6. A circuit comprising:
   an output driver, wherein said output driver comprises a pull-up device and a pull-down device;
   said pull-up device comprising a first control terminal responsive to an RC-timer to bias said pull-up device on in response to an electrostatic discharge (ESD) event that activates a device coupled to an output of said RC-timer; and
   said pull-down device comprising a second control terminal coupled in said circuit such that, in response to said ESD event, said second control terminal is to be biased at a voltage that is between a power supply voltage and a ground voltage for said circuit.

7. The circuit of claim 6, wherein said pull-up device comprises a p-channel transistor and said pull-down device comprises an n-channel transistor.

8. The circuit of claim 7, wherein said RC-timer comprises a resistor-capacitor (RC) network, a first inverting stage and a second inverting stage; wherein said RC network is coupled with an input terminal of said first inverting stage; and an output terminal of said first inverting stage is coupled with an input terminal of said second inverting stage.

9. The circuit of claim 8, wherein an output terminal of said second inverting stage is coupled with a control terminal of said device that is an ESD clamping device, said ESD clamping device comprising a p-channel transistor and said control terminal of said ESD clamping device comprising a gate terminal of said p-channel transistor.

10. The circuit of claim 6, wherein said second control terminal is responsive to an electronic signal from said RC-timer to be biased at said voltage between said power supply voltage and said ground voltage.

11. The circuit of claim 10, further comprising a voltage divider to generate said voltage between said power supply voltage and said ground voltage, said voltage divider being coupled with said RC-timer and said pull-down device.

12. The circuit of claim 11, wherein said voltage divider comprises a plurality of p-channel transistors, said p-channel transistors being coupled in series between a power supply terminal and a ground supply terminal, via their source and drain terminals, and coupled with said RC-timer via their gate terminals, so as to be biased on in response to said ESD event; and
   wherein said second control terminal is coupled with a source terminal of one of said plurality of p-channel transistors and a drain terminal of another of said plurality of p-channel transistors.

13. The circuit of claim 12, wherein said plurality of p-channel transistors comprises two p-channel transistors, said two p-channel transistors having substantially equal channel resistances.

14. A method comprising:
   detecting an electrostatic discharge (ESD) event that activates a device coupled to an output of an RC-timer;
   turning on a pull-up device of an output driver in response to activating said device; and
   applying a voltage to a control terminal of a pull-down device of said output driver during said ESD event, said voltage being a substantially constant fraction of a voltage differential between a power supply voltage and a ground supply voltage.

15. The method of claim 14, wherein applying said voltage includes receiving said voltage from a voltage divider.

16. The method of claim 14, wherein applying said voltage includes applying a voltage of substantially zero volts.

17. The method of claim 14, wherein applying a said voltage includes applying a voltage that is substantially equal to one half of a value of said voltage differential.

* * * * *